US009769951B2

United States Patent
Ding et al.

(10) Patent No.: US 9,769,951 B2
(45) Date of Patent: Sep. 19, 2017

(54) AUTOMOTIVE RADAR SYSTEM AND AUTOMOTIVE RADAR SENSOR MODULE WITH BREATHER STRUCTURE

(71) Applicant: Autoliv ASP, Inc., Ogden, UT (US)

(72) Inventors: Xueru Ding, Newton, MA (US); Jeff Schaefer, Chelmsford, MA (US); Richard Leung, Westford, MA (US)

(73) Assignee: Autoliv ASP, Inc., Ogden, UT (US)

( * ) Notice: Subject to any disclaimer, the term of this patent is extended or adjusted under 35 U.S.C. 154(b) by 0 days.

(21) Appl. No.: 14/794,056

(22) Filed: Jul. 8, 2015

(65) Prior Publication Data

US 2017/0013741 A1    Jan. 12, 2017

(51) Int. Cl.
*H05K 7/20* (2006.01)
*H01L 21/67* (2006.01)
(Continued)

(52) U.S. Cl.
CPC ............ *H05K 7/20127* (2013.01); *G01S 7/02* (2013.01); *H05K 5/0004* (2013.01); *H05K 5/0213* (2013.01); *H05K 5/03* (2013.01); *G01S 13/931* (2013.01); *G01S 2007/027* (2013.01); *H01L 21/67184* (2013.01)

(58) Field of Classification Search
CPC ................ B01D 46/10; B01D 2256/12; B01D 2257/102; B01D 53/261; B01D 2311/2626; B01D 21/2411; H01L 21/67184; H01L 23/467; H01L 21/67017; H01L 21/67167; F24F 1/0007; F24F 13/20; F24F 3/1603; F24F 11/0086; F24F 13/28; F24F 2001/0037; F24F 12/006; F24F 3/16; F24F 3/166; H05K 7/20127; H05K 5/0004;
(Continued)

(56) References Cited

U.S. PATENT DOCUMENTS 4,280,223 A * 7/1981 Roettele .................. G01S 7/022
342/20
5,692,637 A * 12/1997 Hodge ................. G01L 19/0654
174/17 VA
(Continued)

FOREIGN PATENT DOCUMENTS

BE         902906      11/1985
DE        3248715       7/1984
(Continued)

OTHER PUBLICATIONS

Search Report and Written Opinion mailed Sep. 27, 2016 in corresponding PCT Application No. PCT/US2016/040385, filed Jun. 30, 2016.

*Primary Examiner* — Adam B Dravininkas
(74) *Attorney, Agent, or Firm* — Burns & Levinson, LLP; Steven M. Mills

(57) ABSTRACT

A housing for a radar sensor module has a back surface and a plurality of side surfaces connected to the back surface. A vent structure is connected to the back surface and at least one of the side surfaces. The vent structure includes an enclosure enclosing a chamber. A first opening in the vent structure penetrates the at least one of the side surfaces of the housing, such that the chamber is exposed to an exterior of the housing. A second opening in the vent structure penetrates the enclosure such that the chamber is exposed to an interior of the housing.

20 Claims, 5 Drawing Sheets

(51) Int. Cl.
*H05K 5/02* (2006.01)
*H05K 5/00* (2006.01)
*H05K 5/03* (2006.01)
*G01S 7/02* (2006.01)
*G01S 13/93* (2006.01)

(58) Field of Classification Search
CPC .......... H05K 5/03; H05K 5/0213; G01S 7/02; G01S 13/931; G01S 2007/027
See application file for complete search history.

(56) References Cited

U.S. PATENT DOCUMENTS

| | | | |
|---|---|---|---|
| 6,095,568 A | 8/2000 | Fendt et al. | |
| 6,506,110 B1 * | 1/2003 | Borisch | H05K 5/0213 174/17 VA |
| 7,253,356 B2 * | 8/2007 | Kiyota | H02G 3/081 174/17 R |
| 7,380,458 B1 | 6/2008 | Date et al. | |
| 7,907,401 B2 * | 3/2011 | Bolzmann | H05K 5/0073 174/547 |
| 8,273,159 B2 | 9/2012 | Moser et al. | |
| 2002/0063990 A1 * | 5/2002 | Hirasaka | G11B 33/1486 360/97.18 |
| 2002/0089781 A1 * | 7/2002 | Tuma | B01D 46/0036 360/99.2 |
| 2007/0109730 A1 * | 5/2007 | Shigyo | H05K 5/0052 361/600 |
| 2008/0074840 A1 * | 3/2008 | Suzuki | H05K 5/0047 361/679.46 |
| 2008/0101041 A1 * | 5/2008 | Chang | H05K 5/0213 361/728 |
| 2009/0047896 A1 | 2/2009 | Wolff | |
| 2010/0201560 A1 * | 8/2010 | Chen | G01S 7/022 342/20 |
| 2010/0271563 A1 * | 10/2010 | Oda | G03B 21/16 348/789 |
| 2014/0293240 A1 * | 10/2014 | Nakano | G03B 21/16 353/52 |
| 2015/0208525 A1 * | 7/2015 | Negishi | H05K 5/0056 361/752 |
| 2016/0113131 A1 * | 4/2016 | Ernesti | H05K 5/0213 312/236 |

FOREIGN PATENT DOCUMENTS

| | | |
|---|---|---|
| DE | 102006053111 | 5/2008 |
| DE | 102006053114 | 5/2008 |
| EP | 862354 | 9/1998 |
| FR | 2573948 | 11/1984 |
| GB | 9722996 | 1/1998 |
| WO | 2006045685 | 5/2006 |
| WO | 2014090235 | 6/2014 |

* cited by examiner

AUTOMOTIVE RADAR SYSTEM AND AUTOMOTIVE RADAR SENSOR MODULE WITH BREATHER STRUCTURE

BACKGROUND

1. Technical Field

The present disclosure is related to automotive radar systems and, in particular, to an automotive radar sensor module housing having a breather structure which substantially prevents moisture and debris from entering the module.

2. Discussion of Related Art

Breather structures or vent structures are commonly used in climate-proof sealing of many electronic devices and modules. In the automotive radar industry, breather structures are used to provide ventilation in radar sensor modules.

A conventional breather or vent is a structure which is coupled to the housing of an electronic module, such as an automotive radar sensor module. The structure typically includes several venting holes and an air-through but waterproof, i.e., semipermeable, material, which in many cases is heat-staked to the module housing.

FIGS. 1-3 illustrate a conventional automotive radar sensor module 10 with a conventional breather structure or vent structure 18. Specifically, FIG. 1 includes a schematic perspective view of a conventional assembled radar sensor module, FIG. 2 includes a schematic perspective view of a portion of the interior of a housing of a conventional radar sensor module; and FIG. 3 includes a schematic top view of the interior of a housing of a conventional radar sensor module. Referring to FIGS. 1-3, module 10 includes a housing 14, which can contain all of the components of radar sensor module 10. For example, housing 14 can contain one or more printed circuit boards (PCBs), cables, connectors, flexprints and/or other forms of interconnects, and/or other electronic devices as required to carry out the operations of radar sensor module 10. Housing 14 can include an integral shelf 25 formed in side walls 20, 22 and back side 12 of housing 14 to support one or more electronic devices such as PCBs. These devices, e.g., PCBs, can be held stationary and in place by heat stake posts 26. Housing 14 can also include connector shroud portion 16, which allows electrical connections, i.e., wires, cables, etc., to penetrate housing 14 and make electrical connection with any of the electronic devices disposed within the interior of housing 14 of module 10.

Conventional breather structure or vent structure 18 is formed in back side 12 of housing 14. Breather structure 18 includes multiple through holes 24 which penetrate back side 12 of housing 14 to vent housing 14 to the external environment. This structure suffers some intrinsic disadvantages. For example, during inclement weather conditions or under poor road conditions, venting holes 24 can become plugged and/or blocked by dirt, salt, debris, water, snow, ice, and/or other foreign material, which can cause degradation in operation of radar sensor module 10.

SUMMARY

According to one aspect, a housing for a radar sensor module is provided. The housing includes a back surface and a plurality of side surfaces connected to the back surface. A vent structure is connected to the back surface and at least one of the side surfaces. The vent structure includes an enclosure enclosing a chamber. A first opening of the vent structure penetrates the at least one of the side surfaces of the housing, such that the chamber is exposed to an exterior of the housing. A second opening of the vent structure penetrates the enclosure such that the chamber is exposed to an interior of the housing.

In some exemplary embodiments, the housing can include plastic, which, in some embodiments, is molded plastic.

In any of the embodiments, the vent structure can be at least partially molded integrally with the housing.

The vent structure can further include a semipermeable diaphragm over at least the second opening.

In some exemplary embodiments, the first opening has a first cross-sectional area in a first plane, the first cross-sectional area being larger than a second cross-sectional area of the chamber in a second plane parallel to the first plane, such that accumulation of foreign material in the chamber is reduced.

In some exemplary embodiments, the chamber can include a substantially trapezoidal shape in cross-section.

In some exemplary embodiments, the radar sensor module is an automotive radar sensor module.

In some exemplary embodiments, the back surface is substantially planar.

According to another aspect, a vented radar sensor module is provided. The module includes a housing having a back surface and a plurality of side surfaces connected to the back surface. The module also includes a vent structure connected to the back surface and at least one of the side surfaces of the housing. The vent structure includes an enclosure enclosing a chamber. A first opening of the vent structure penetrates the at least one of the side surfaces of the housing, such that the chamber is exposed to an exterior of the housing. A second opening of the vent structure penetrates the enclosure such that the chamber is exposed to an interior of the housing.

In some exemplary embodiments, the housing can include plastic, which, in some embodiments, is molded plastic.

In any of the embodiments, the vent structure can be at least partially molded integrally with the housing.

The vent structure can further include a semipermeable diaphragm over at least the second opening.

In some exemplary embodiments, the first opening has a first cross-sectional area in a first plane, the first cross-sectional area being larger than a second cross-sectional area of the chamber in a second plane parallel to the first plane, such that accumulation of foreign material in the chamber is reduced.

In some exemplary embodiments, the chamber can include a substantially trapezoidal shape in cross-section.

In some exemplary embodiments, the radar sensor module is an automotive radar sensor module.

In some exemplary embodiments, the back surface of the housing is substantially planar.

BRIEF DESCRIPTION OF THE DRAWINGS

The present disclosure is further described in the detailed description which follows, in reference to the noted plurality of drawings by way of non-limiting examples of embodiments of the present disclosure, in which like reference numerals represent similar parts throughout the several views of the drawings.

DETAILED DESCRIPTION

Figure 1:
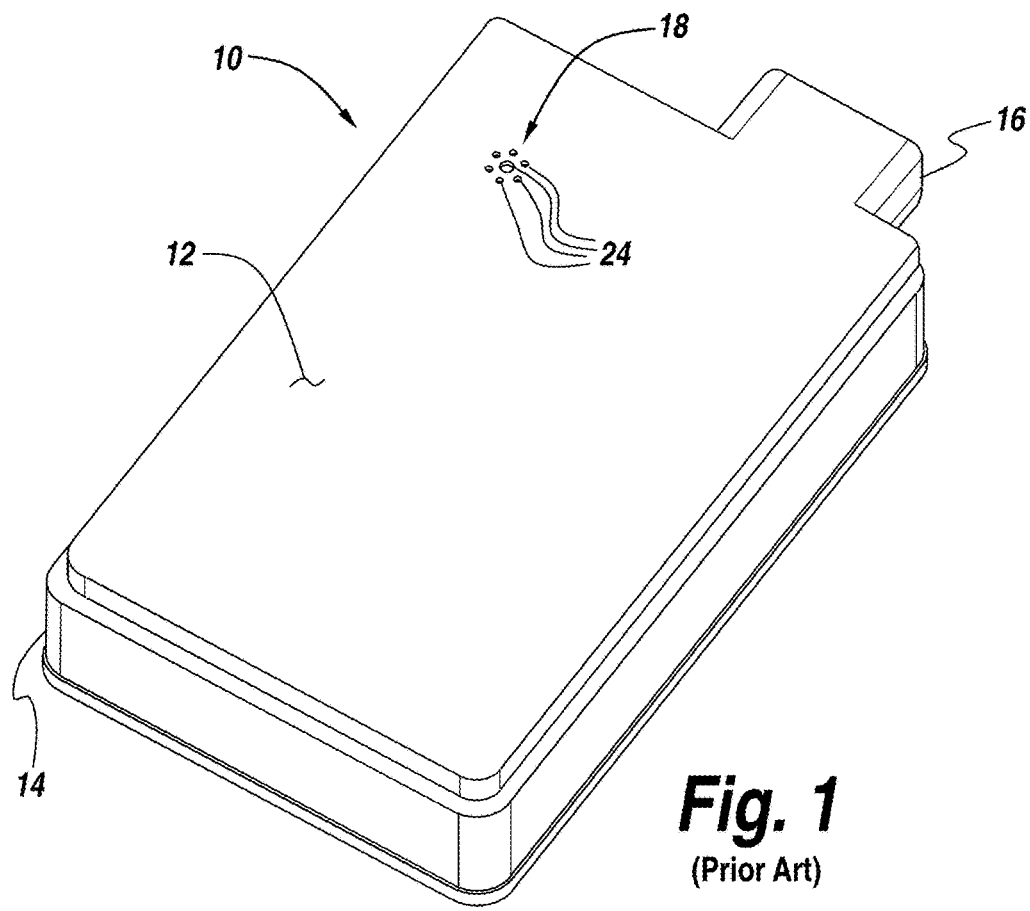
FIG. 1 includes a schematic perspective view of a conventional radar sensor module.
Figure 2:
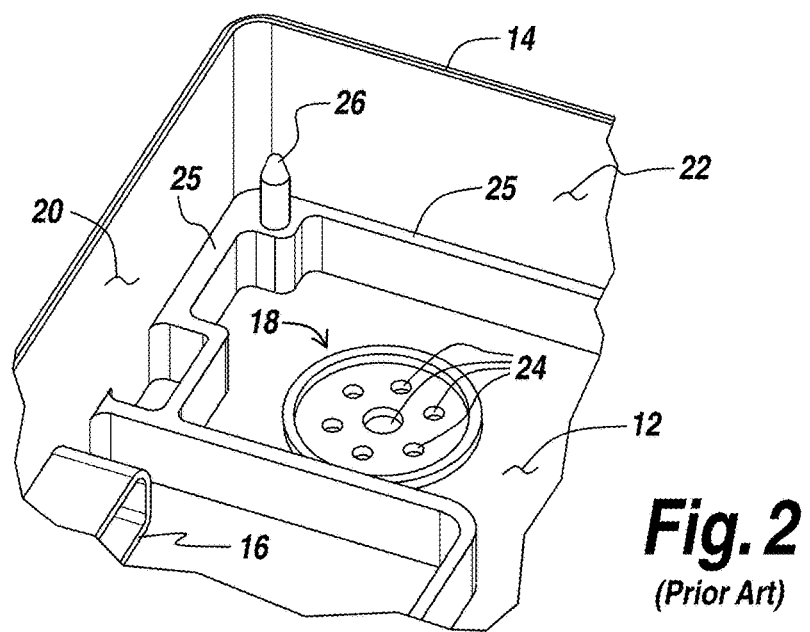
FIG. 2 includes a schematic perspective view of a portion of the interior of a housing of a conventional radar sensor module.
Figure 3:
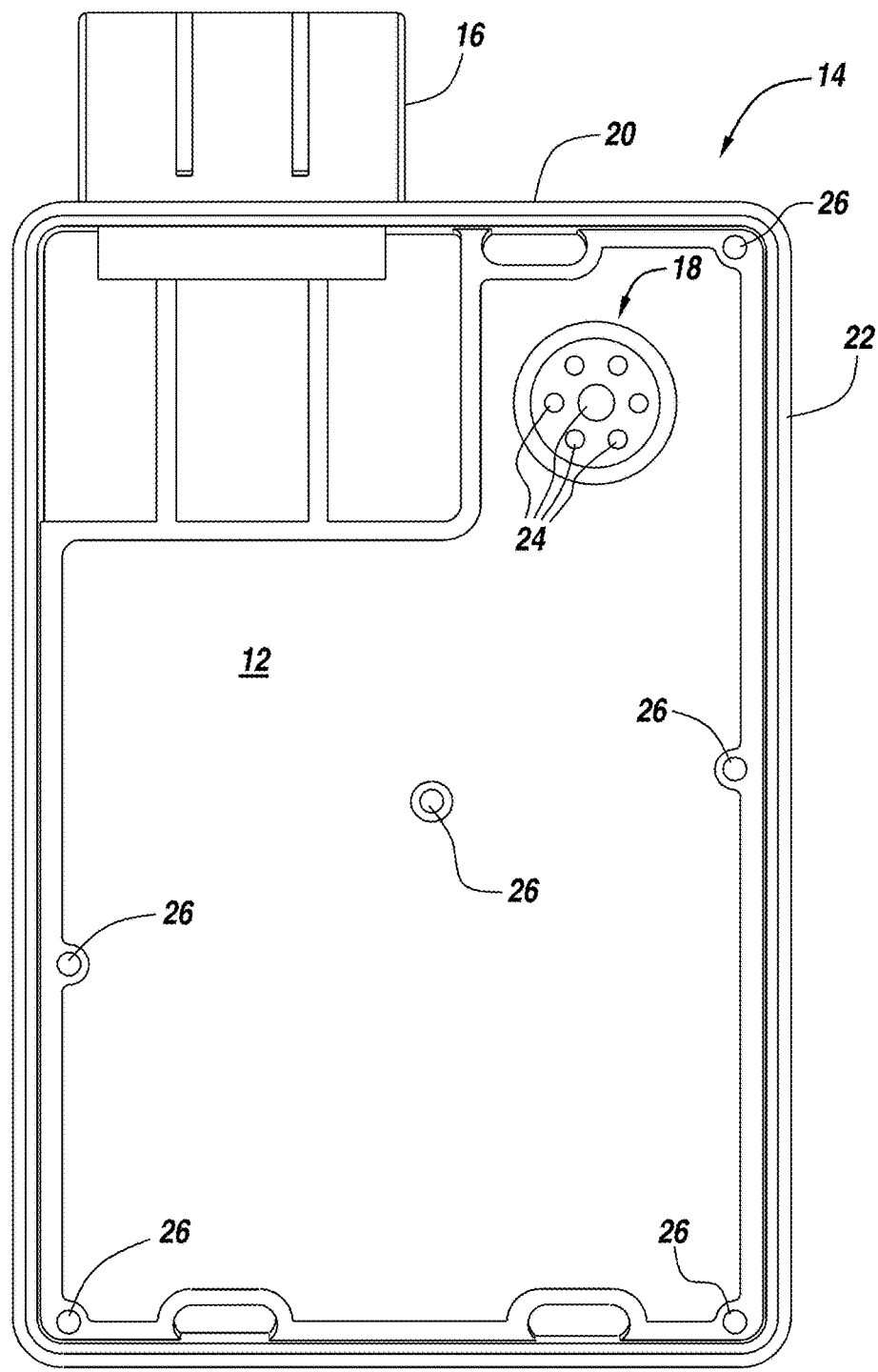
FIG. 3 includes a schematic top view of the interior of a housing of a conventional radar sensor module.
Figure 4:
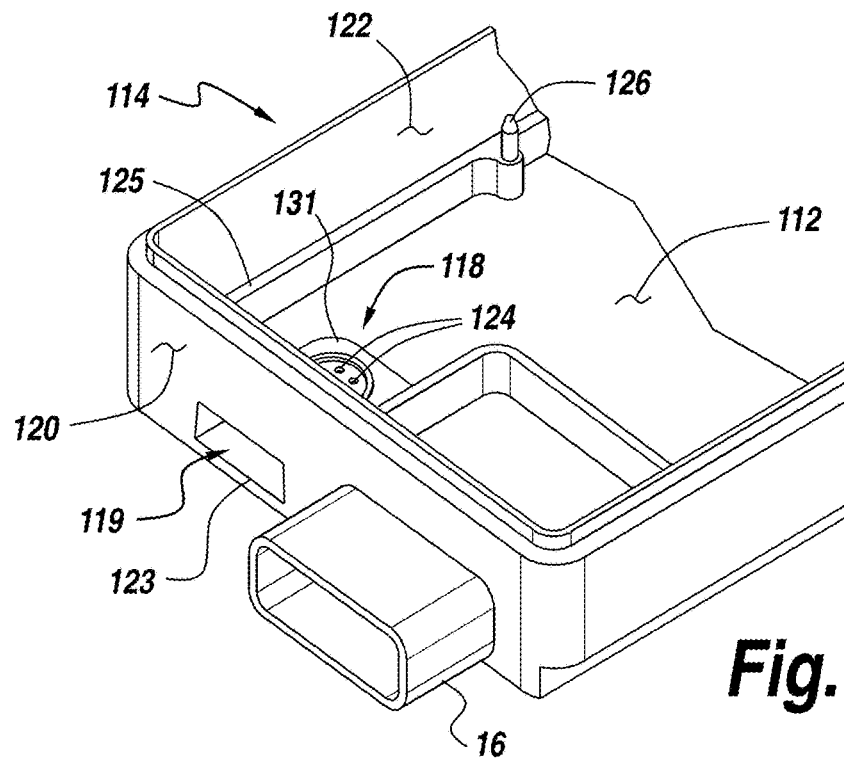
FIG. 4 includes a schematic perspective view of a portion of the interior of a housing of a radar sensor module having a channelized breather structure, according to some exemplary embodiments.

As noted above, the conventional breather or venting structure 18 illustrated in FIGS. 1-3 suffers some intrinsic disadvantages. For example, during inclement weather conditions or under poor road conditions, venting holes 24 can become plugged and/or blocked by dirt, salt, debris, water, snow, ice, and/or other foreign material, which can cause degradation in operation of radar sensor module 10. According to the exemplary embodiments described in detail herein, a channelized breather structure is provided such that these drawbacks of the conventional structures are substantially reduced or eliminated.

Figure 5A:
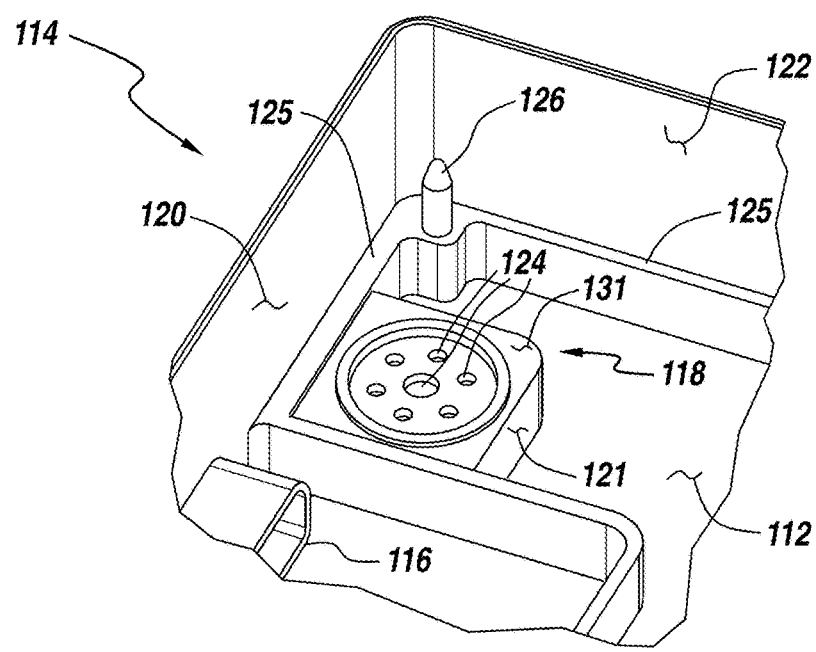
FIG. 5A includes a schematic perspective view of a portion of the interior of a housing of a radar sensor module having a channelized breather structure, according to some exemplary embodiments.
Figure 5B:
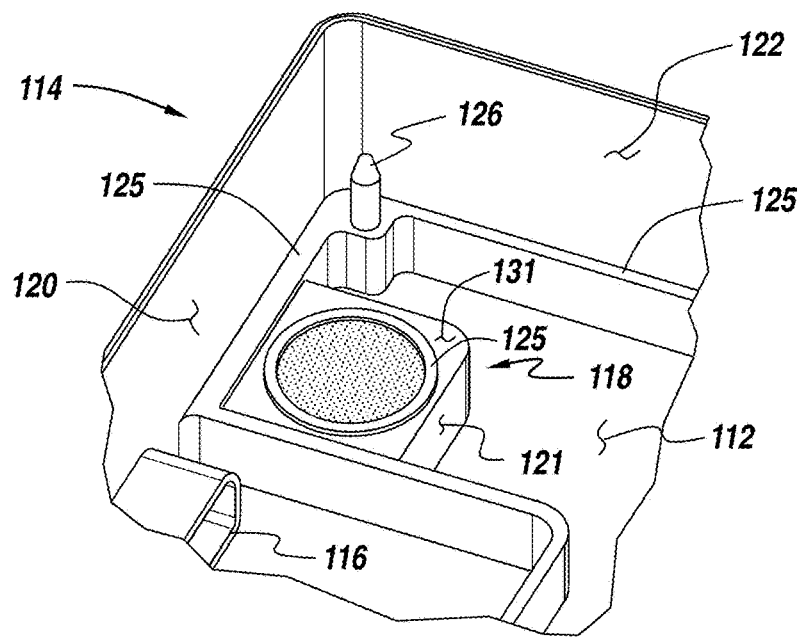
FIG. 5B includes a schematic perspective view of the portion of the interior of a housing of a radar sensor module having a channelized breather structure illustrated in FIG. 5A, including an installed semipermeable diaphragm or screen element in the breather structure, according to some exemplary embodiments.
Figure 6:
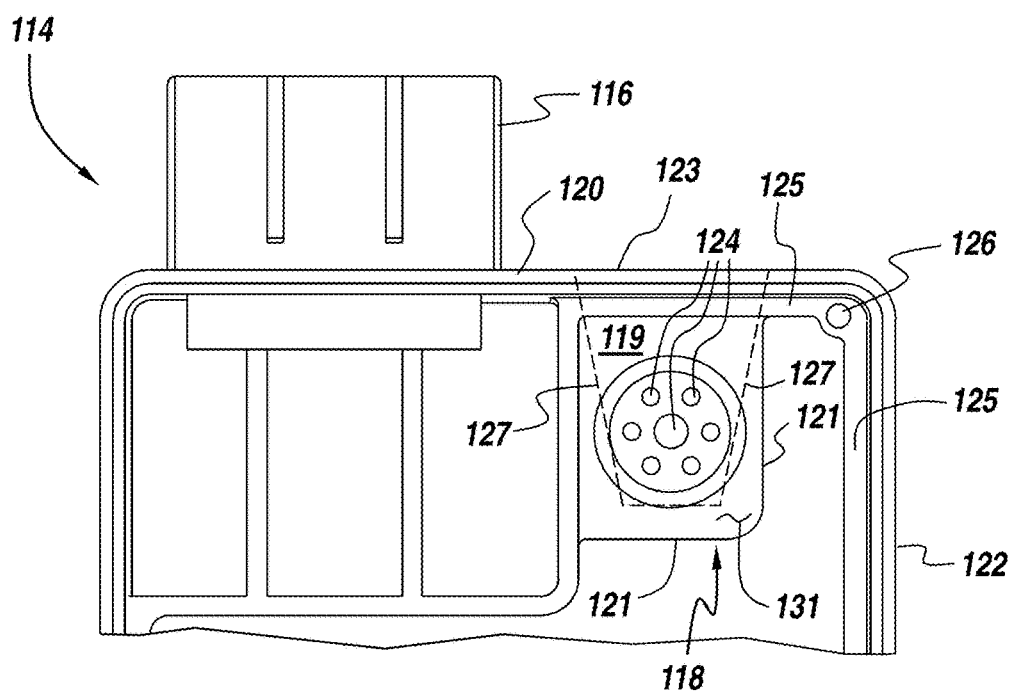
FIG. 6 includes a schematic top view of a portion of the interior of a housing of a radar sensor module having a channelized breather structure, according to some exemplary embodiments.
Figure 7:
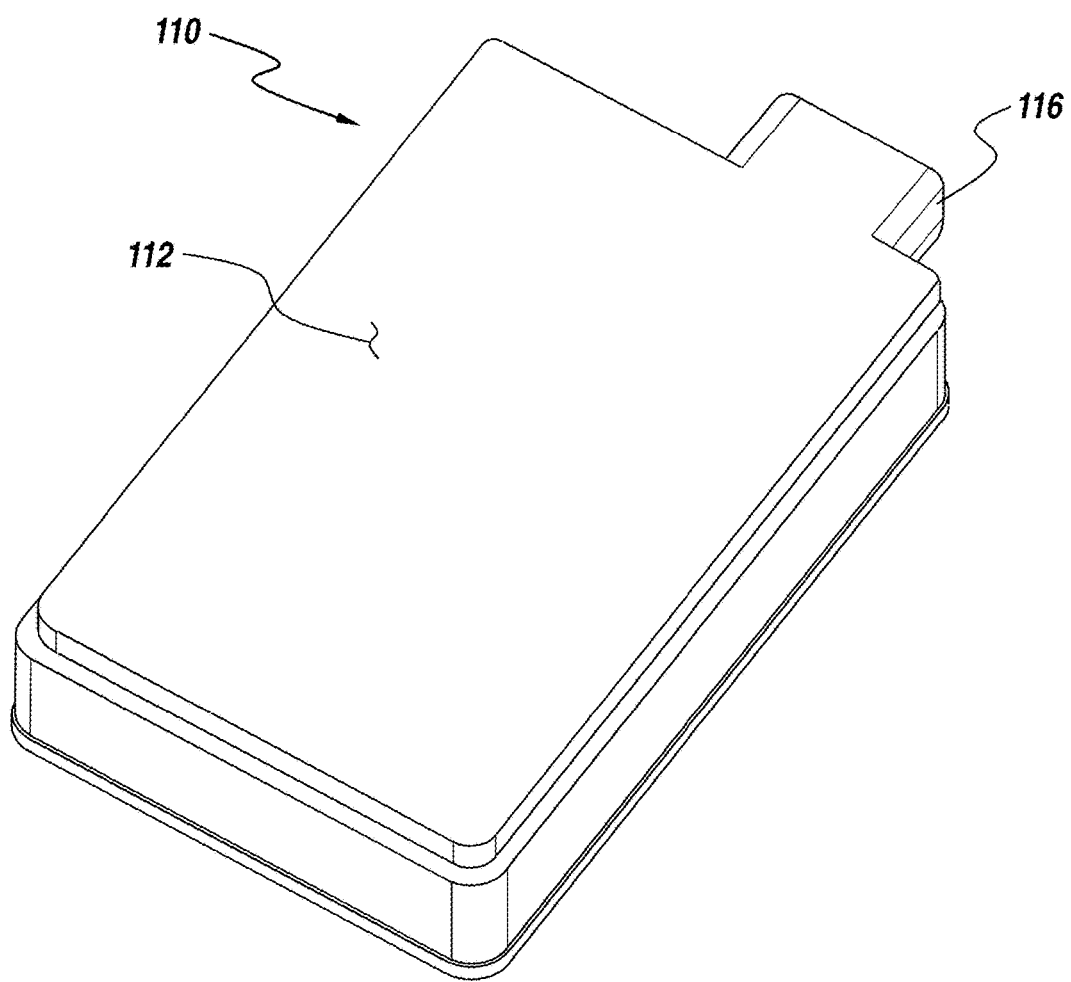
FIG. 7 includes a schematic perspective view of a radar sensor module having a channelized breather structure, according to some exemplary embodiments.

FIGS. 4, 5A, 5B, 6 and 7 illustrate an automotive radar sensor module 110 with a channelized breather structure or vent structure, according to some exemplary embodiments. Specifically, FIG. 4 includes a schematic perspective view of a portion of the interior of a housing of a radar sensor module having a channelized breather structure, according to some exemplary embodiments. FIG. 5A includes a schematic perspective view of a portion of the interior of a housing of a radar sensor module having a channelized breather structure, according to some exemplary embodiments. FIG. 5B includes a schematic perspective view of the portion of the interior of a housing of a radar sensor module having a channelized breather structure illustrated in FIG. 5A, including an installed semipermeable diaphragm or screen element in the breather structure, according to some exemplary embodiments. FIG. 6 includes a schematic top view of a portion of the interior of a housing of a radar sensor module having a channelized breather structure, according to some exemplary embodiments. FIG. 7 includes a schematic perspective view of a radar sensor module having a channelized breather structure, according to some exemplary embodiments.

Referring to FIGS. 4, 5A, 5B, 6 and 7, radar sensor module 110 according to some exemplary embodiments includes a housing 114, which can contain all of the components of radar sensor module 110. For example, housing 114 can contain one or more PCBs, cables, connectors, flexprints and/or other forms of interconnects, and/or other electronic devices as required to carry out the operations of radar sensor module 110. Housing 114 can include an integral shelf 125 formed in side walls 120, 122 and back side 112 of housing 114 to support one or more electronic devices such as PCBs. These devices, e.g., PCBs, can be held stationary and in place by heat stake posts 126. Housing 114 can also include connector shroud portion 116, which allows electrical connections, i.e., wires, cables, etc., to penetrate housing 114 and make electrical connection with any of the electronic devices disposed within the interior of housing 114 of module 110.

Housing 114 also includes a channelized breather structure or vent structure 118, according to some exemplary embodiments, which provides the breathing/venting functions to module 110. In contrast to conventional breather structures, such as breather structure 18 illustrated in FIGS. 1-3, breather structure 118 of the present disclosure is not formed to penetrate back side 112 of housing 114 to the exterior of module 110. Instead, breather structure 118 is formed with side walls 121 and a top surface 131 above the surface of back side 112. The interior of channelized breather structure 118 includes a channel or chamber 119 defined by the volume of space disposed between and enclosed by side walls 121 and top surface 131 of breather structure 118, as well as the portion of back side 112 within the region defined by side walls 121 of breather structure 118 and side wall 120 of housing 114.

Channelized breather structure 118 includes multiple through holes 124 which penetrate top surface 131 of breather structure 118 to vent housing 114 into chamber or channel 119. As illustrated in FIG. 5B, a breathing element in the form of semipermeable diaphragm or screen member 125 can be installed in place over through holes 124 as a protection against the entry of small particles of debris into the interior of housing 114. Semipermeable diaphragm 125 can be installed by some known process, such as heat staking. An opening 123 penetrating side wall 120 opens chamber or channel 119 to the external environment, thus venting housing 114 and assembled module 110. As illustrated most clearly in FIG. 6, chamber or channel 119 has a shape such that opening 123 is relatively large in cross-sectional area, compared with other cross-sections of chamber or channel 119 parallel to opening 123. In some exemplary embodiments, as illustrated in FIG. 6, chamber or channel 119 can have tapered side walls 127, such that chamber or channel 119 can have a substantially trapezoidal shape.

In some exemplary embodiments, because of the substantially larger opening 123 and sloped or tapered chamber side walls 127, the likelihood of any debris, moisture, or other foreign matter being trapped in chamber 119 is substantially reduced or eliminated. In fact, any such debris, moisture, excess water or other foreign matter that may enter chamber 119 would tend to flow out of chamber 119 to the exterior of housing 114. Also, since no vent holes for breather structure 118 are exposed to the exterior of housing 114, and, in particular, to the exposed back side 112 of housing 114, any hit of water, salt, dirt, mud or other undesirable foreign material, will not result in any such material directly entering housing 114. This greatly enhances the operational reliability of radar sensor module 110.

In some exemplary embodiments, housing 114 can be made of an insulating plastic material. The plastic material can be formed by a known process such as plastic molding. Various features of housing 114 can be molded integrally with housing 114. For example, shelf 125, heat stake posts 126 and breather structure 118, which includes side walls 121, top surface 131 and through holes 124, can be formed integrally with housing 114 in a single molding process. As noted above, semipermeable diaphragm 125 can be formed as a separate element and can be installed on top of breather structure 118 by some known process such as heat staking. It will be understood that these materials and fabrication processes are exemplary only. The present disclosure is applicable to other housing materials and other manufacturing processes.

Whereas many alterations and modifications of the disclosure will no doubt become apparent to a person of ordinary skill in the art after having read the foregoing description, it is to be understood that the particular embodiments shown and described by way of illustration are in no way intended to be considered limiting. Further, the subject matter has been described with reference to particular embodiments, but variations within the spirit and scope of the disclosure will occur to those skilled in the art. It is noted that the foregoing examples have been provided merely for the purpose of explanation and are in no way to be construed as limiting of the present disclosure.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

The invention claimed is:

1. A housing for a radar sensor module, comprising:
    a back surface;
    a plurality of side surfaces connected to the back surface; and
    a vent structure connected to the back surface and at least one of the side surfaces, the vent structure comprising:
        an enclosure having an interior,
        a first opening in the enclosure facing a first direction, the first opening penetrating the at least one of the side surfaces of the housing, the first direction being substantially perpendicular to the at least one of the side surfaces, such that the interior of the enclosure is exposed via the first opening to an exterior of the housing, and
        a second opening in the enclosure facing a second direction different than the first direction, the second direction being substantially parallel to the at least one of the side surfaces, the second opening penetrating the enclosure such that the interior of the enclosure is exposed via the second opening to an interior of the housing.

2. The housing of claim 1, wherein the housing comprises plastic.

3. The housing of claim 1, wherein the housing comprises molded plastic.

4. The housing of claim 3, wherein the vent structure is at least partially molded integrally with the housing.

5. The housing of claim 1, wherein the vent structure is at least partially molded integrally with the housing.

6. The housing of claim 1, wherein the vent structure further comprises a semipermeable diaphragm over at least the second opening.

7. The housing of claim 1, wherein the first opening has a first cross-sectional area in a first plane, the first cross-sectional area being larger than a second cross-sectional area of the interior of the enclosure in a second plane parallel to the first plane, such that accumulation of foreign material in the chamber is reduced.

8. The housing of claim 1, wherein the interior of the enclosure comprises a substantially trapezoidal shape in cross-section.

9. The housing of claim 1, wherein the radar sensor module is an automotive radar sensor module.

10. The housing of claim 1, wherein the back surface is substantially planar.

11. A vented radar sensor module, comprising:
    a housing having a back surface and a plurality of side surfaces connected to the back surface; and
    a vent structure connected to the back surface and at least one of the side surfaces of the housing, the vent structure comprising:
        an enclosure having an interior,
        a first opening in the enclosure facing a first direction, the first opening penetrating the at least one of the side surfaces of the housing, the first direction being substantially perpendicular to the at least one of the side surfaces, such that the interior of the enclosure is exposed via the first opening to an exterior of the housing, and
        a second opening in the enclosure facing a second direction different than the first direction, the second direction being substantially parallel to the at least one of the side surfaces, the second opening penetrating the enclosure such that the interior of the enclosure is exposed via the second opening to an interior of the housing.

12. The vented radar sensor module of claim 11, wherein the housing comprises plastic.

13. The vented radar sensor module of claim 11, wherein the housing comprises molded plastic.

14. The vented radar sensor module of claim 13, wherein the vent structure is at least partially molded integrally with the housing.

15. The vented radar sensor module of claim 11, wherein the vent structure is at least partially molded integrally with the housing.

16. The vented radar sensor module of claim 11, wherein the vent structure further comprises a semipermeable diaphragm over at least the second opening.

17. The vented radar sensor module of claim 11, wherein the first opening has a first cross-sectional area in a first plane, the first cross-sectional area being larger than a second cross-sectional area of the interior of the enclosure in a second plane parallel to the first plane, such that accumulation of foreign material in the chamber is reduced.

18. The vented radar sensor module of claim 11, wherein the interior of the enclosure comprises a substantially trapezoidal shape in cross-section.

19. The vented radar sensor module of claim 11, wherein the radar sensor is an automotive radar sensor.

20. The vented radar sensor module of claim 11, wherein the back surface of the housing is substantially planar.

* * * * *